(12) United States Patent
Avouris et al.

(10) Patent No.: US 8,987,705 B2
(45) Date of Patent: Mar. 24, 2015

(54) CARBON NANOTUBE TRANSISTOR EMPLOYING EMBEDDED ELECTRODES

(71) Applicants: International Business Machines Corporation, Armonk, NY (US); Karlsruher Institut fuer Technologie, Karlsruhe (DE)

(72) Inventors: Phaedon Avouris, Yorktown Heights, NY (US); Yu-ming Lin, Poughkeepsie, NY (US); Mathias B. Steiner, Croton-on-Hudson, NY (US); Michael W. Engel, Karlsruhe (DE); Ralph Krupke, Stutensee (DE)

(73) Assignees: International Business Machines Corporation, Armonk, NY (US); Karlsruher Institut fuer Technologie (KIT) (DE)

( * ) Notice: Subject to any disclaimer, the term of this patent is extended or adjusted under 35 U.S.C. 154(b) by 0 days.

(21) Appl. No.: 14/150,954

(22) Filed: Jan. 9, 2014

(65) Prior Publication Data

US 2014/0124736 A1     May 8, 2014

Related U.S. Application Data

(62) Division of application No. 13/278,552, filed on Oct. 21, 2011, now Pat. No. 8,629,010.

(51) Int. Cl.
*H01L 29/06* (2006.01)
*H01L 31/00* (2006.01)
(Continued)

(52) U.S. Cl.
CPC .......... *H01L 29/775* (2013.01); *H01L 51/0003* (2013.01); *H01L 51/0048* (2013.01);
(Continued)

(58) Field of Classification Search
USPC ................... 257/E21.268, E21.279, E21.293; 438/157, 176, 195, 161, FOR. 210, 780, 438/779
See application file for complete search history.

(56) References Cited

U.S. PATENT DOCUMENTS

| 6,891,227 B2 | 5/2005 | Appenzeller et al. |
| 7,253,431 B2 | 8/2007 | Afzali-Ardakani et al. |

(Continued)

OTHER PUBLICATIONS

Dong, L. et al., "Floating-Potential Dielectrophoresis-Controlled Fabrication of Single-Carbon-Nanotube Transistors and Their Electrical Properties" Journal of Phys. Chem. B. (Jun. 17, 2005) pp. 13148-13153, vol. 109, No. 27.

(Continued)

*Primary Examiner* — William F Kraig
*Assistant Examiner* — Khaja Ahmad
(74) *Attorney, Agent, or Firm* — Scully, Scoot, Murphy & Presser, P.C.; Vazken Alexanian

(57) ABSTRACT

Carbon nanotubes can be aligned with compatibility with semiconductor manufacturing processes, with scalability for forming smaller devices, and without performance degradation related to structural damages. A planar structure including a buried gate electrode and two embedded electrodes are formed. After forming a gate dielectric, carbon nanotubes are assembled in a solution on a surface of the gate dielectric along the direction of an alternating current (AC) electrical field generated by applying a voltage between the two embedded electrodes. A source contact electrode and a drain contact electrode are formed by depositing a conductive material on both ends of the carbon nanotubes. Each of the source and drain contact electrodes can be electrically shorted to an underlying embedded electrode to reduce parasitic capacitance.

18 Claims, 14 Drawing Sheets

(51) Int. Cl.
  *H01L 29/775* (2006.01)
  *H01L 51/00* (2006.01)
  *B82Y 10/00* (2011.01)
  *H01L 51/05* (2006.01)

(52) U.S. Cl.
  CPC ............ *B82Y10/00* (2013.01); *H01L 29/0669* (2013.01); *H01L 29/0673* (2013.01); *H01L 51/0545* (2013.01)
  USPC .................................... 257/24; 257/E21.411

(56) References Cited

U.S. PATENT DOCUMENTS

| | | | |
|---|---|---|---|
| 7,960,713 | B2 | 6/2011 | Hunt et al. |
| 2003/0160235 | A1 | 8/2003 | Hirai |
| 2004/0023514 | A1 | 2/2004 | Moriya et al. |
| 2005/0212014 | A1* | 9/2005 | Horibe et al. ................. 257/213 |
| 2006/0237537 | A1 | 10/2006 | Empedocles et al. |
| 2007/0063304 | A1* | 3/2007 | Matsumoto et al. .......... 257/462 |
| 2008/0173864 | A1* | 7/2008 | Fujita et al. ..................... 257/40 |
| 2008/0296563 | A1 | 12/2008 | Bourgoin et al. |
| 2009/0020764 | A1* | 1/2009 | Anderson et al. ............... 257/77 |
| 2009/0267060 | A1 | 10/2009 | Forrest et al. |
| 2009/0294966 | A1 | 12/2009 | Liu et al. |
| 2010/0163844 | A1 | 7/2010 | Ermolov |
| 2011/0156109 | A1 | 6/2011 | Gazit et al. |
| 2012/0292602 | A1* | 11/2012 | Guo et al. ....................... 257/40 |

OTHER PUBLICATIONS

Stokes, P. et al., "Local-gated Single-walled Carbon Nanotube Field Effect Transistors Assembled by AC Dielectrophoresis" Nanotechnology (Jan. 21, 2008) pp. 1-5, vol. 19.

Stokes, P. et al., "High Quality Solution Processed Carbon Nanotube Transistors Assembled by Dielectrophoresis" Applied Physics Letters (Feb. 2010) pp. 083110-1-083110-3, vol. 96.

Kim, S. et al., "Single-Walled Carbon Nanotube Transistors Fabricated by Advanced Alignment Techniques Utilizing CVD Growth and Dielectrophoresis" Solid-State Electronics (Aug. 2008) pp. 1260-1263, vol. 52.

Svensson, J., "Carbon Nanotube Transistors: Nanotube Growth, Contact Properties and Novel Devices" Thesis for the Degree of Doctor of Philosophy, University of Gothenburg (May 2010).

* cited by examiner

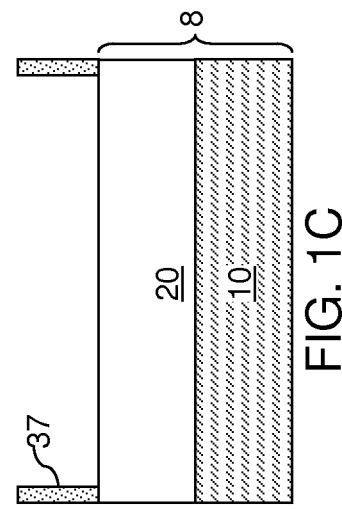
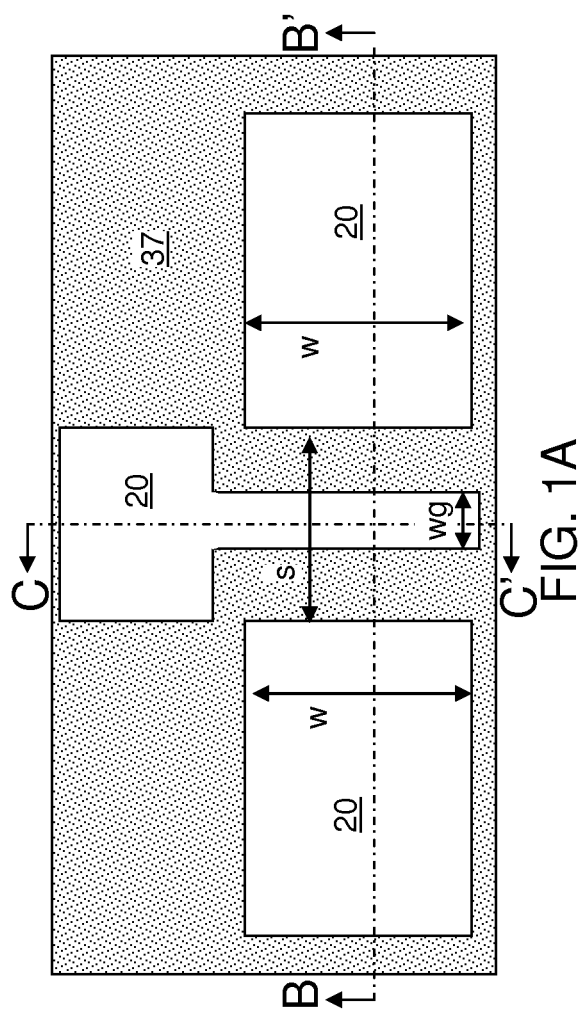
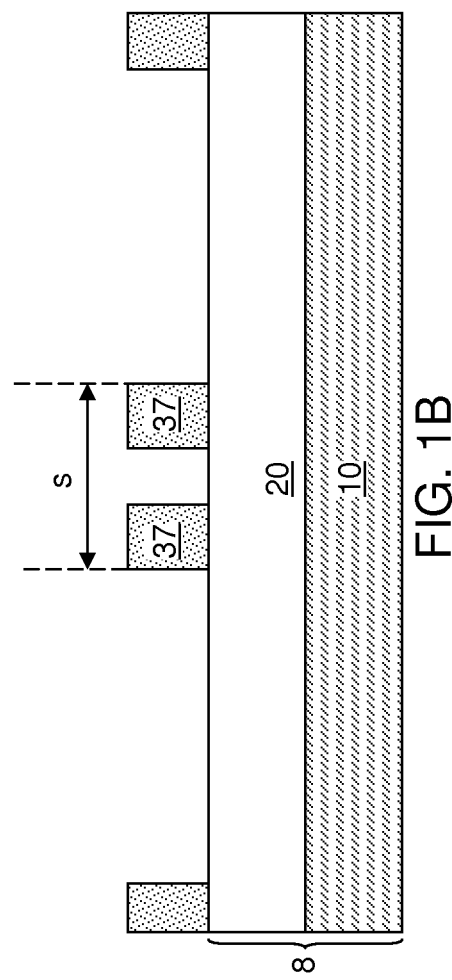
FIG. 1A
FIG. 1B
FIG. 1C

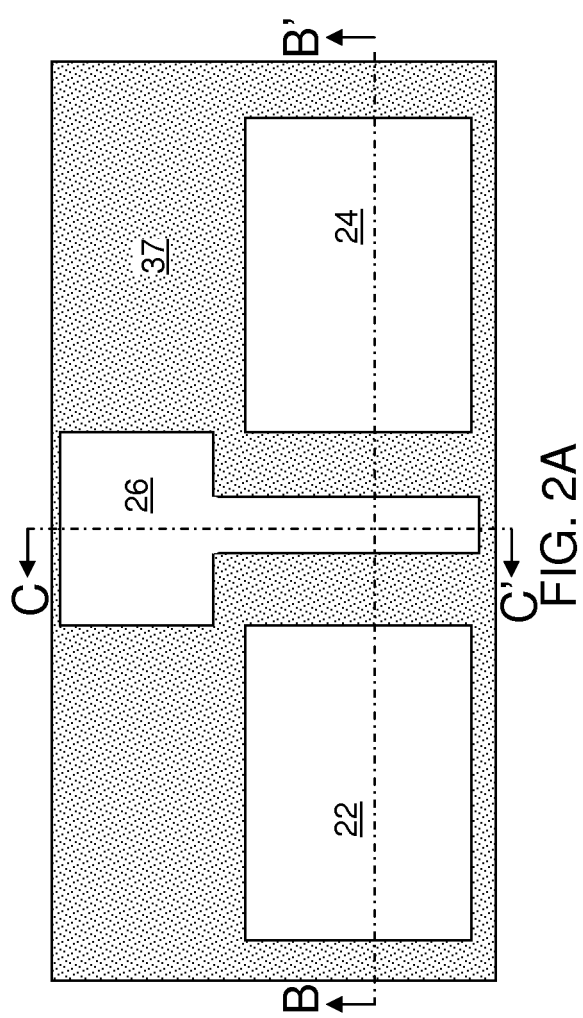
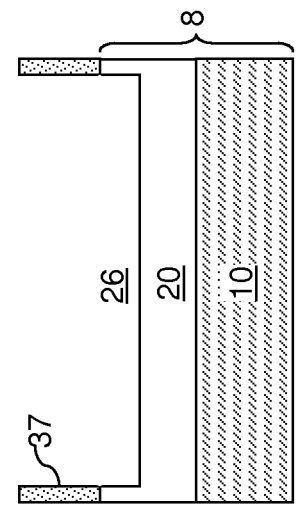
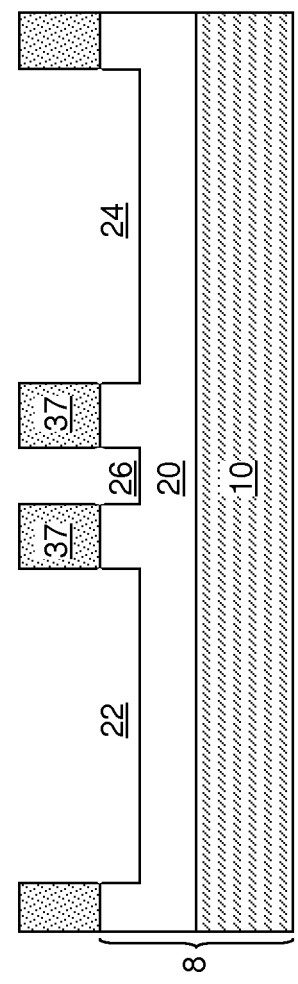
FIG. 2A
FIG. 2B
FIG. 2C

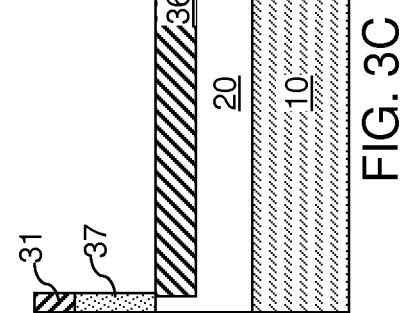
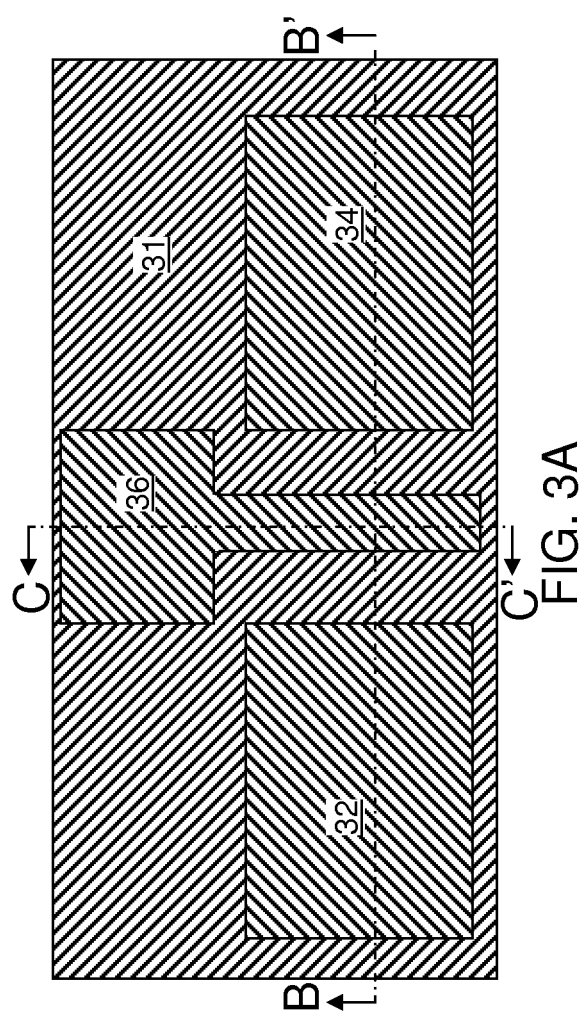
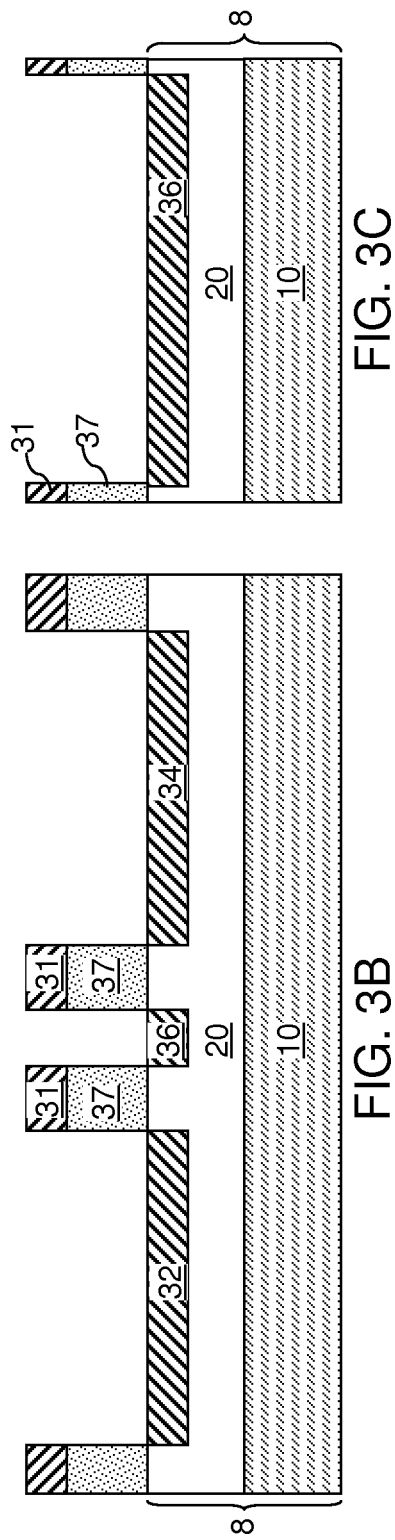

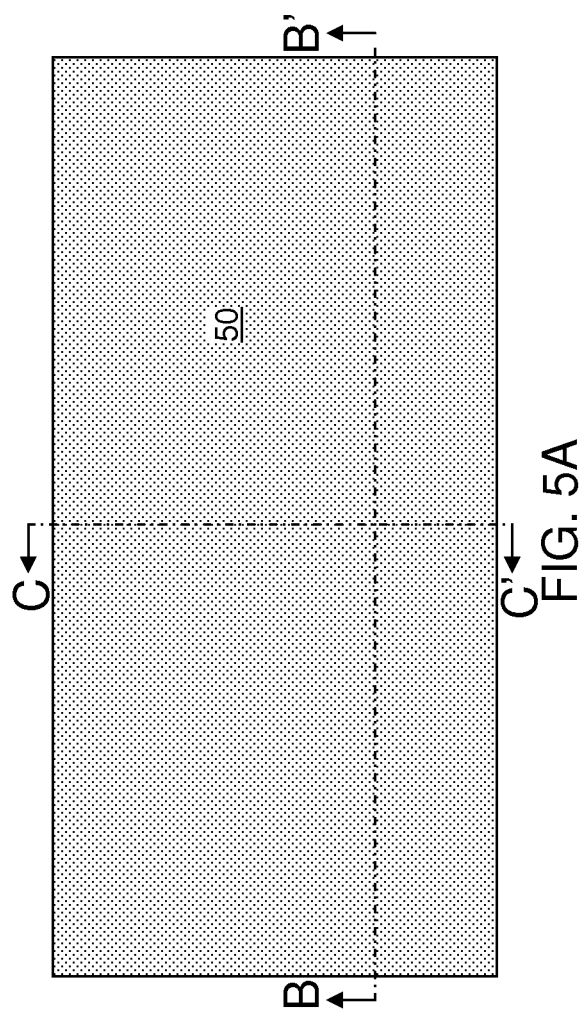
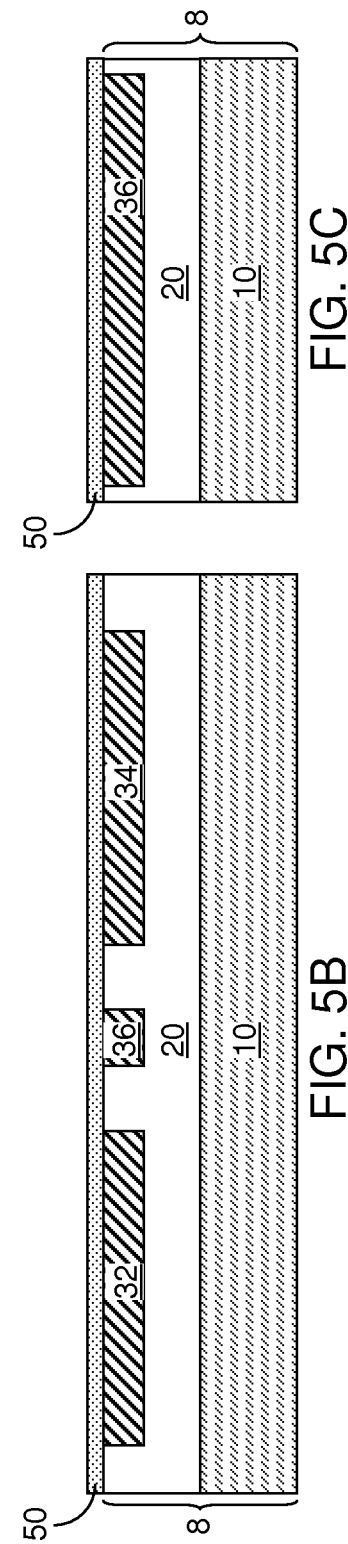
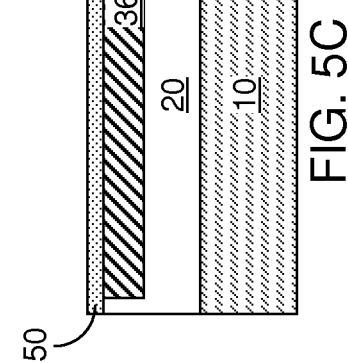

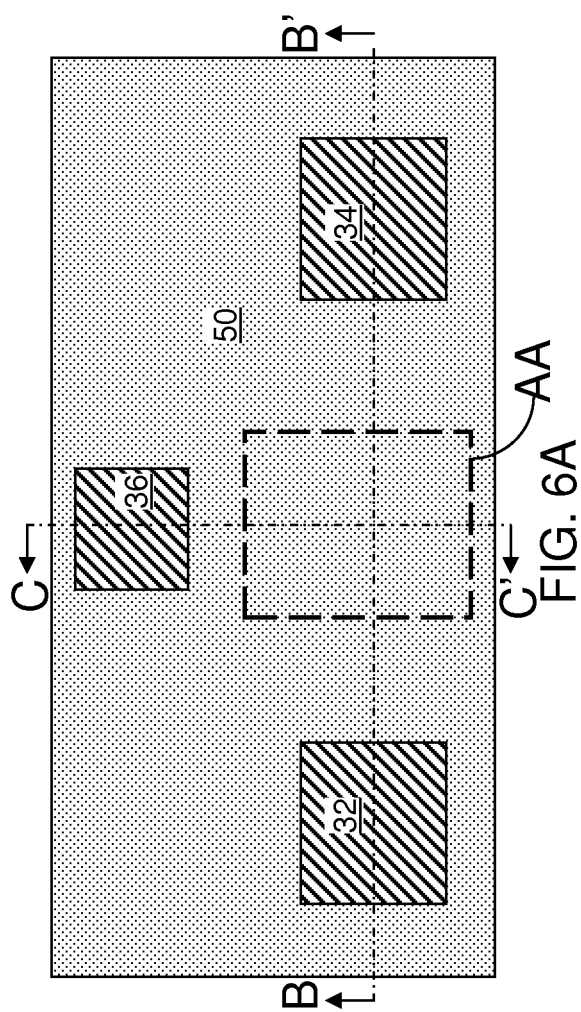
FIG. 6A
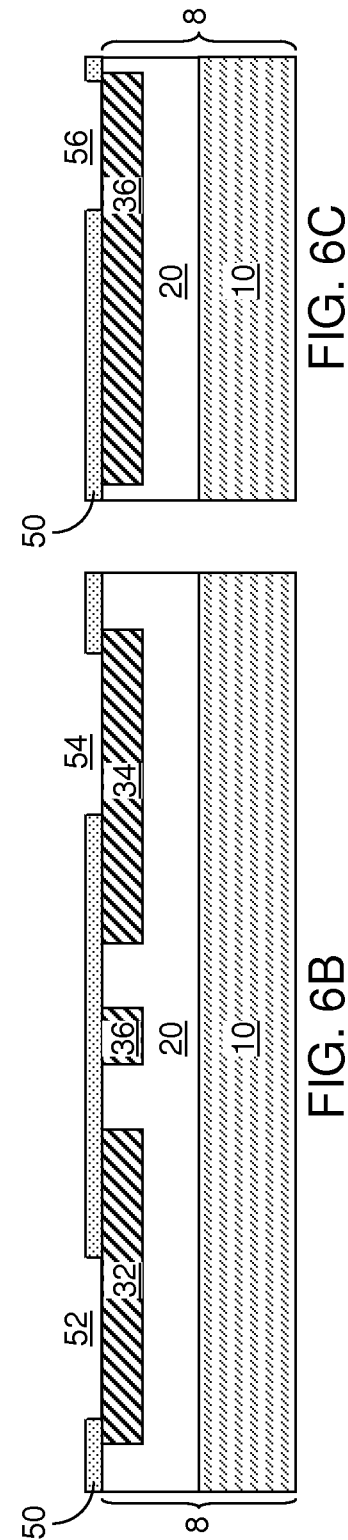
FIG. 6B
FIG. 6C

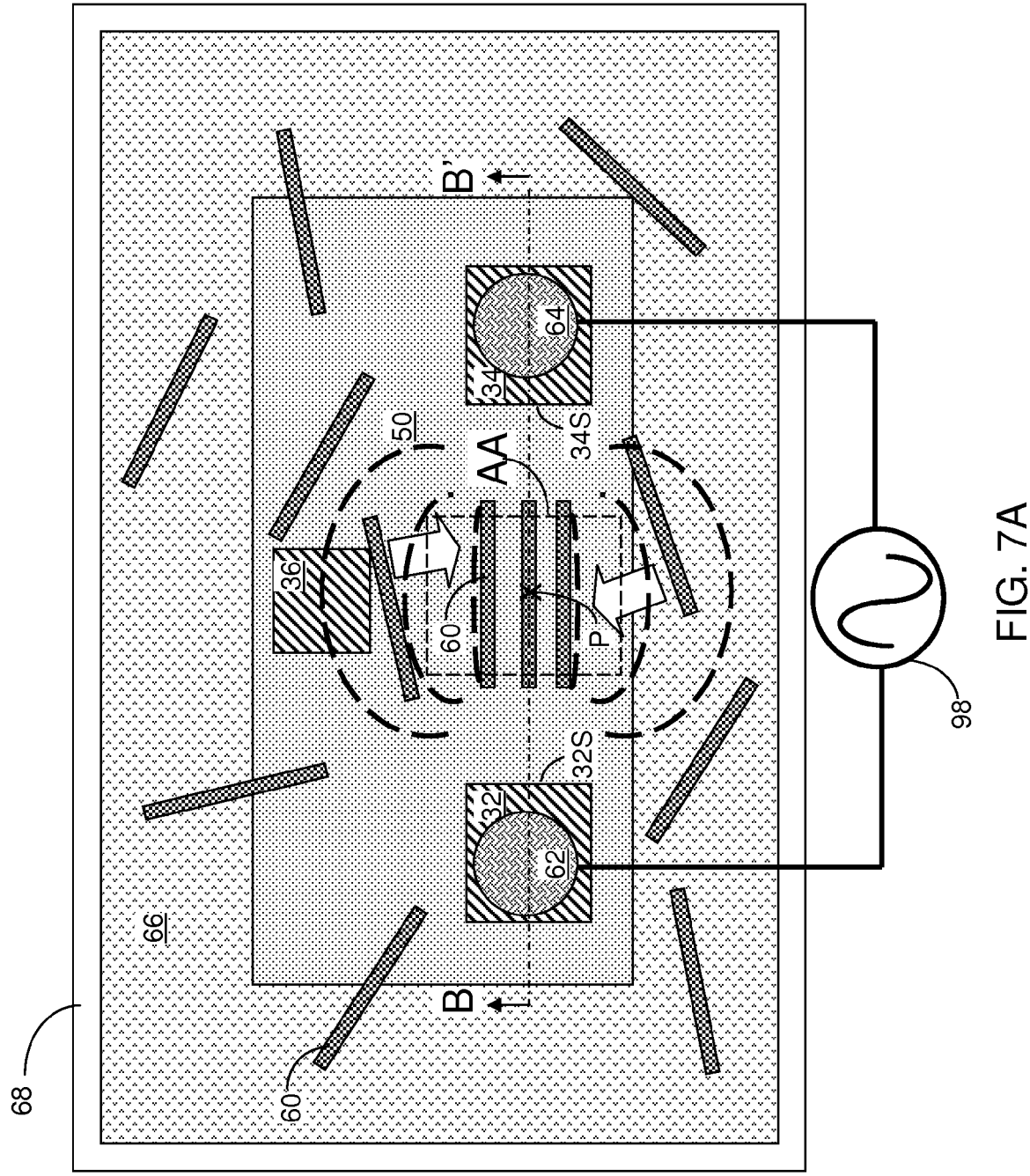

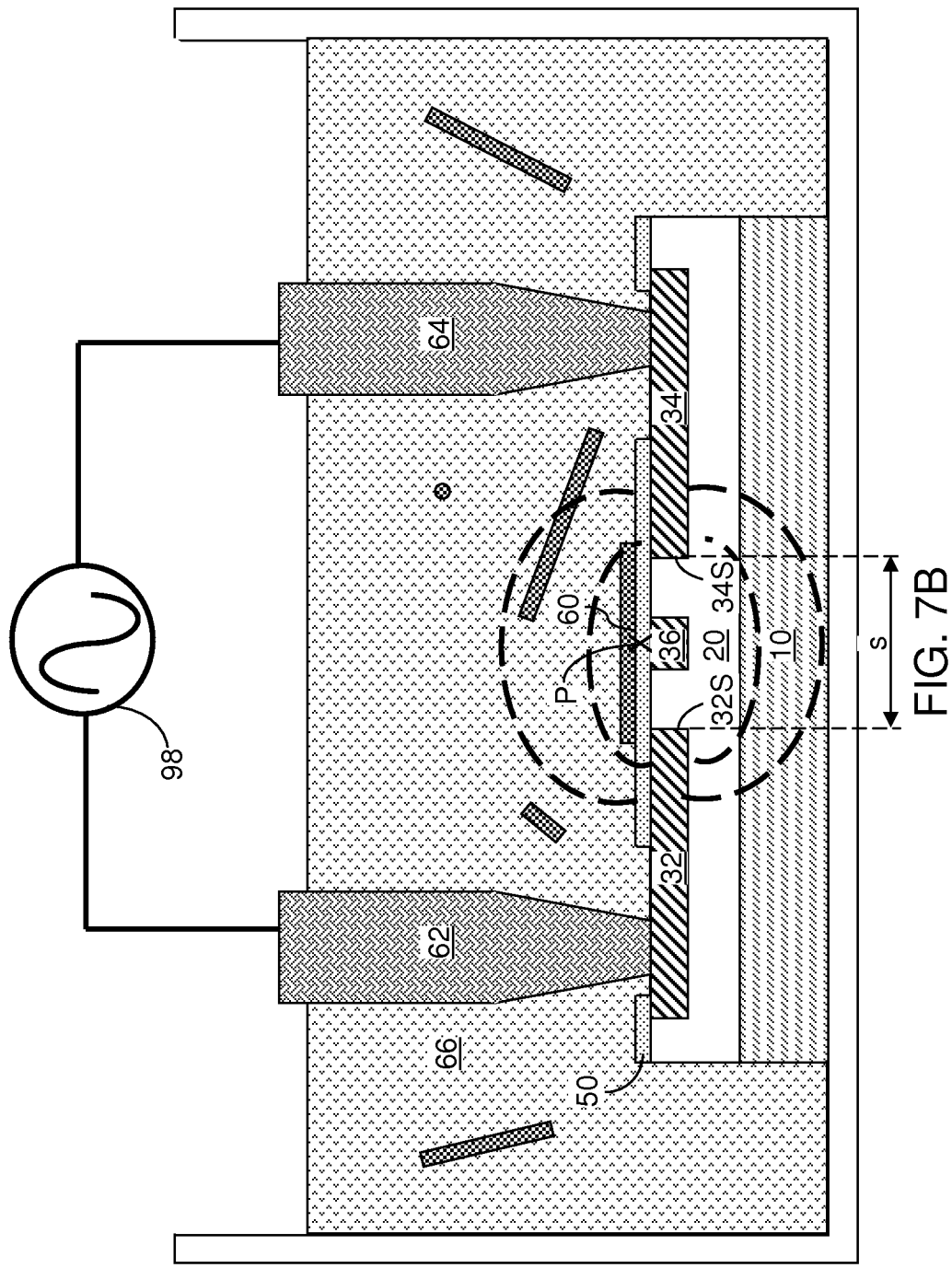

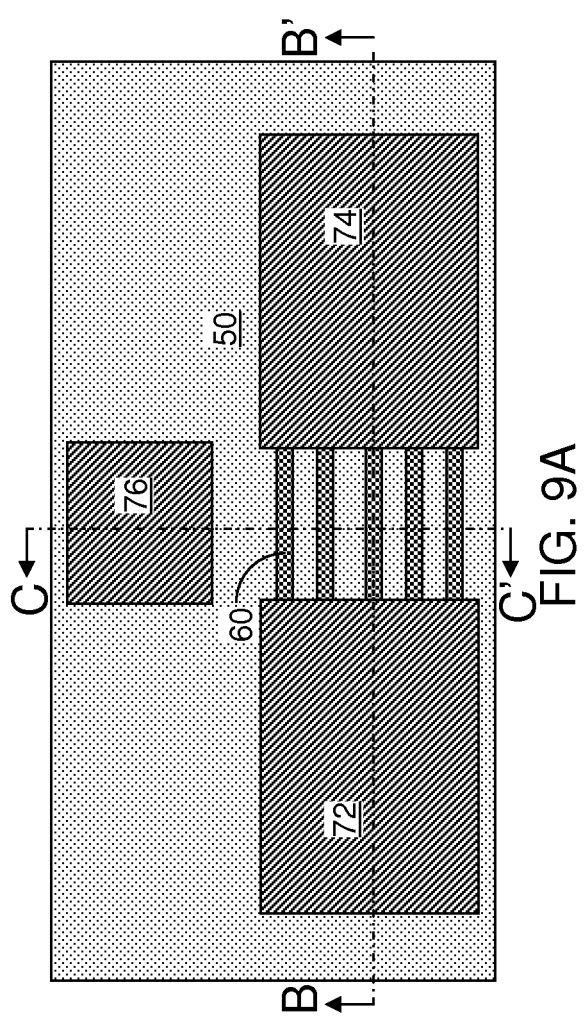
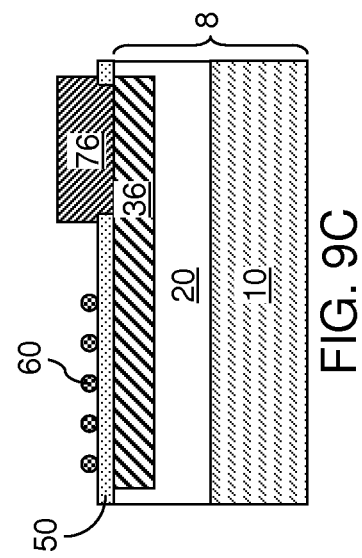
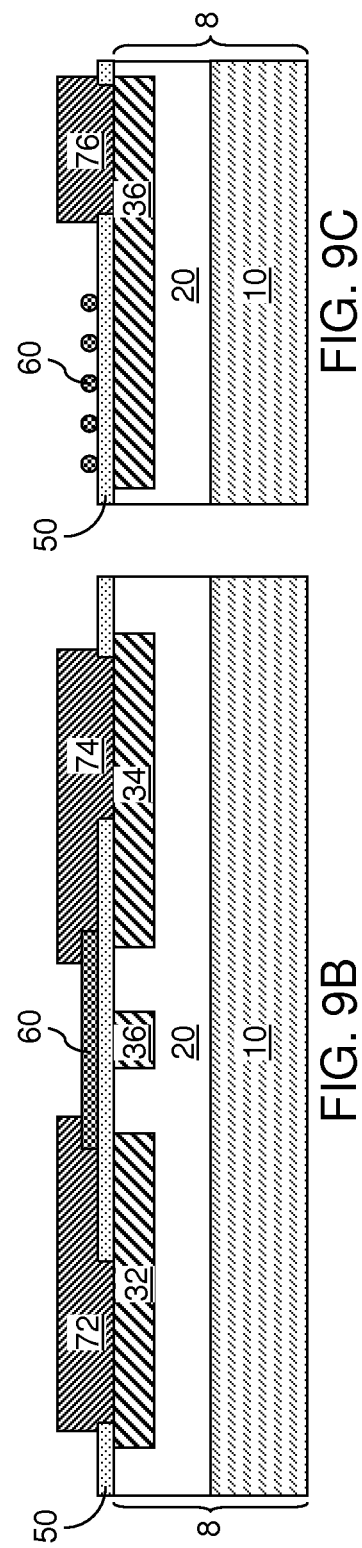

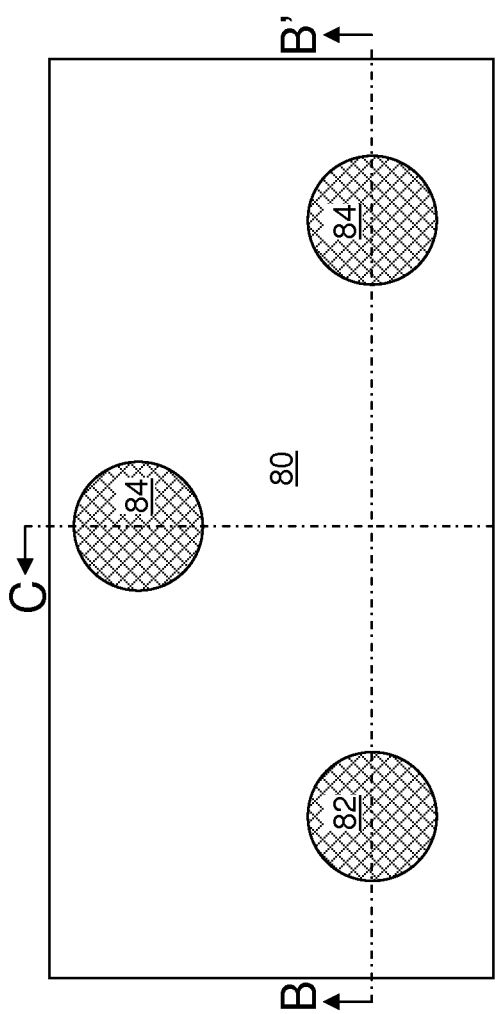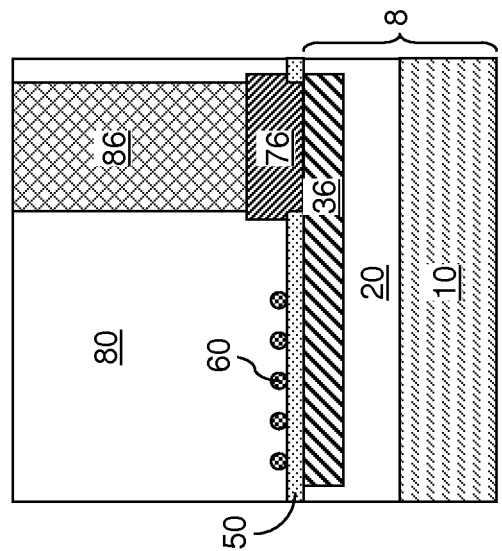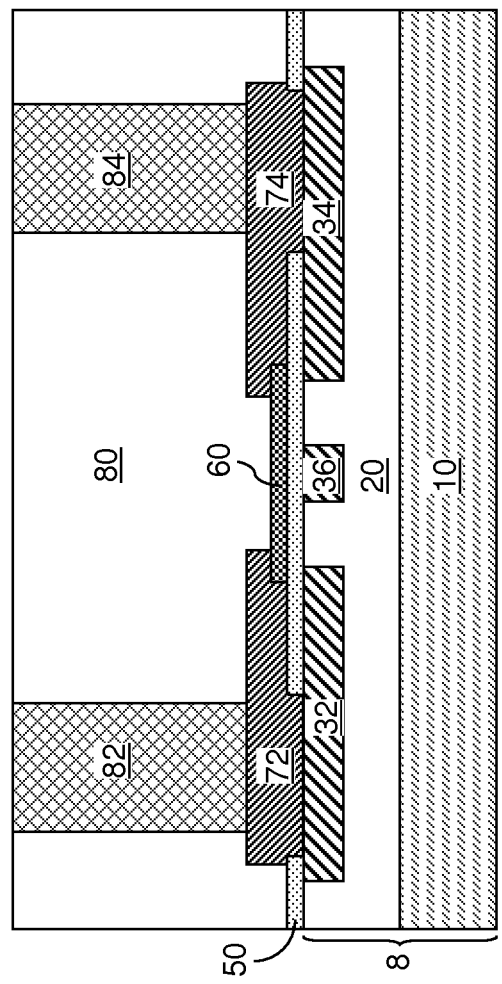

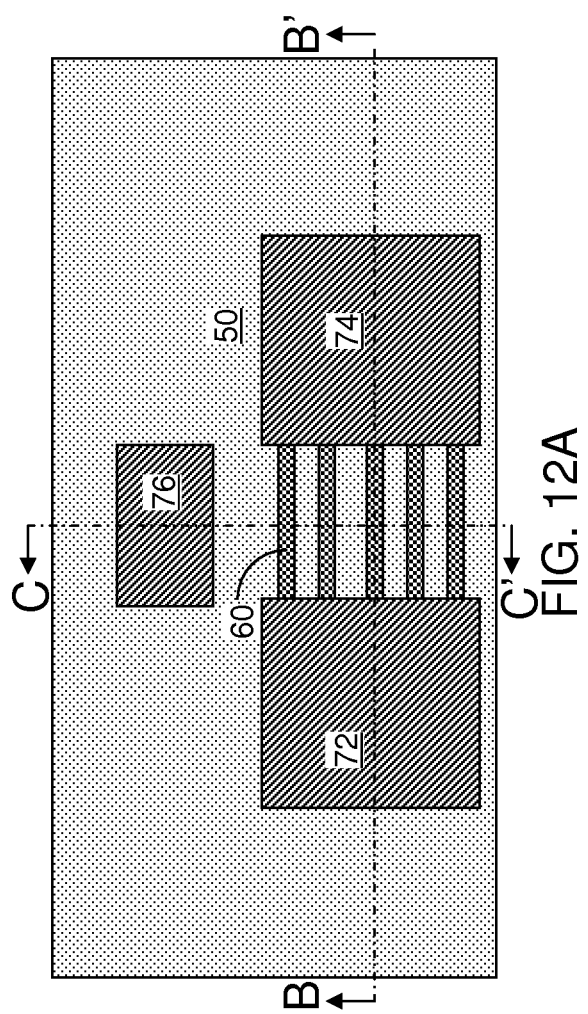
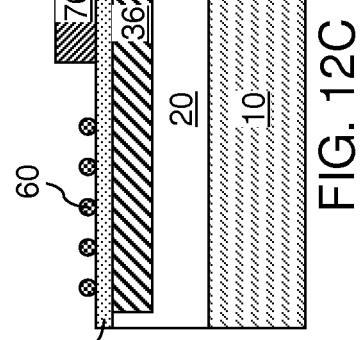
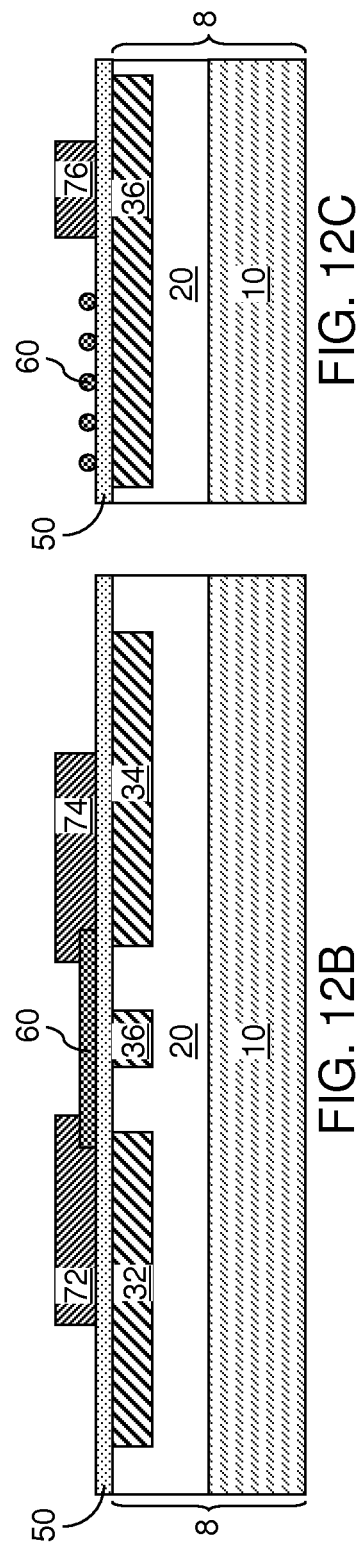
FIG. 12A
FIG. 12B
FIG. 12C

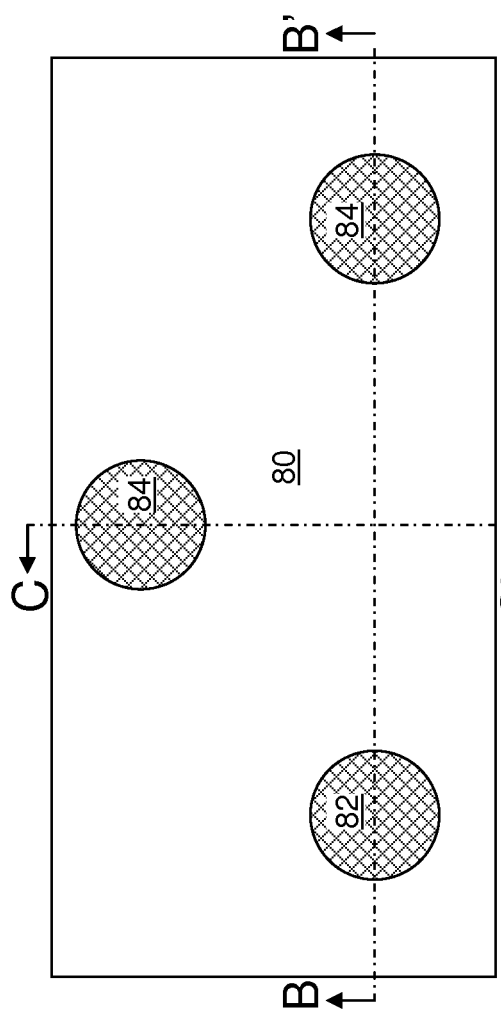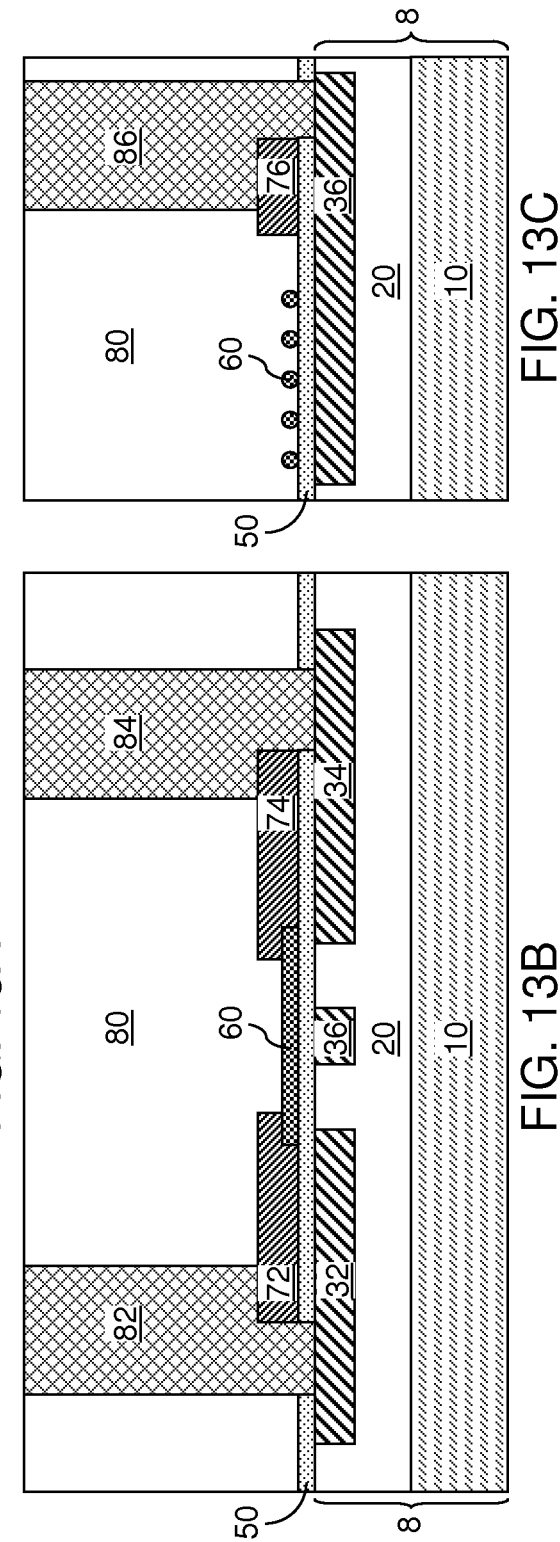

CARBON NANOTUBE TRANSISTOR EMPLOYING EMBEDDED ELECTRODES

RELATED APPLICATIONS

This application is a divisional of U.S. application Ser. No. 13/278,552 filed on Oct. 21, 2011, the entire content and disclosure of which is incorporated herein by reference.

BACKGROUND

The present disclosure relates to a carbon nanotube device, and particularly to a carbon nanotube transistor employing carbon nanotubes self-aligned to embedded electrodes and methods of manufacturing the same.

Semiconducting carbon nanotubes are direct bandgap semiconductors and have potential as channel material in high-frequency analog and digital electronic devices. For their technological application, however, carbon nanotubes have to be separated, placed, contacted, and gated in a controlled way. So far, there are no scalable methods or processes known that allow for producing high-performance carbon nanotube transistors with technologically relevant performance and yields.

Usually, two approaches have been proposed for fabricating carbon nanotube field-effect transistors. In the first approach, the carbon nanotubes are grown or dispersed globally on a substrate. In this case, there is only limited control of either the electronic type of the carbon nanotubes or of their density and orientation. While the first approach allows easy formation of carbon nanotubes, the lack of alignment among carbon nanotubes introduces difficulty when integration with semiconductor technology is attempted because current semiconductor manufacturing processes rely on lithographic alignment to enable large scale integration.

In the second approach, carbon nanotubes are placed locally in the device by either chemical or electrical means. These processes involve chemical treatment, transfer, heating, and bending of carbon nanotubes which all result in a deterioration of the transistor performance. The greater the degree of structural and/or chemical damage to the carbon nanotubes, the greater the degradation in the performance of field effect transistors in the second approach.

Another important issue in the design of high-speed carbon nanotube devices has been the limited choice of gate metals and gate dielectric materials and thickness that is critical in view of scaling and integration. Yet another issue is the lack of scalability in the currently available processes for handling carbon nanotubes in order to provide a smaller and faster carbon nanotube device.

In view of the above, there exists a need to provide a process for aligning carbon nanotubes in a manner that is compatible with currently available semiconductor manufacturing processes, is scalable to devices having smaller dimensions, and prevents structural or chemical damages so that performance of the carbon nanotube transistor can be maximized.

SUMMARY

A method of aligning carbon nanotubes with compatibility with semiconductor manufacturing processes, with scalability for forming smaller devices, and without performance degradation related to structural damages is provided. A planar structure including a buried gate electrode and two embedded electrodes are formed. After forming a gate dielectric, carbon nanotubes are assembled in a solution on a surface of the gate dielectric along the direction of an alternating current (AC) electrical field generated by applying a voltage between the two embedded electrodes. A source contact electrode and a drain contact electrode are formed by depositing a conductive material on both ends of the carbon nanotubes. Each of the source and drain contact electrodes can be electrically shorted to an underlying embedded electrode to reduce parasitic capacitance.

Specifically, two embedded electrodes and a buried gate electrode are formed within a substrate by recessing portions of an insulating layer at a top portion of the substrate, and subsequently filling the recessed portions with a conductive material. After forming a gate dielectric over the buried gate electrodes, the substrate is immersed in a bath of a carbon-nanotube-including solution. An alternating current (AC) voltage is applied across the embedded electrodes through a pair of conductive structures that contact the embedded electrodes. An AC electrical field induces carbon nanotubes in the carbon-nanotube-including solution to self-align in the direction of the AC electrical field between the two embedded electrodes. The carbon nanotubes are attached to the gate dielectric upon contact. After removal of the substrate from the carbon-nanotube-including solution, a source contact electrode and a drain contact electrode are formed by masked deposition of a conductive material on the aligned carbon nanotubes. A contact via structure is formed to contact the source contact electrode and an underlying embedded electrode. Another contact via structure is formed to contact the drain contact electrode and another underlying embedded electrode. By electrically shorting each pair of a contact electrode and an underlying embedded electrode, parasitic capacitance can be minimized.

According to an aspect of the present disclosure, a method of forming a structure including a plurality of parallel carbon nanotubes is provided. The method includes: forming a pair of embedded electrodes in an insulator layer of a substrate; immersing the substrate in a carbon-nanotube-including solution; applying an alternating current (AC) voltage across the pair of embedded electrodes at a voltage amplitude and frequency that induces carbon nanotubes to be aligned in a direction of an electrical field generated by the AC voltage. A plurality of carbon nanotubes in physical proximity to a dielectric surface of a dielectric material on the substrate is attached to the dielectric surface in substantially parallel self-alignment along the electrical field.

According to another aspect of the present disclosure, a structure includes a first embedded electrode and a second embedded electrode located in an insulator layer of a substrate; a dielectric layer located on a surface of the insulator layer; a plurality of carbon nanotubes that are substantially parallel to one another and located on a portion of the dielectric layer overlying a portion of the insulator layer between the first embedded electrode and the second embedded electrode; a first contact electrode in contact with one end of each of the plurality of carbon nanotubes and electrically shorted to the first embedded electrode; and a second contact electrode in contact with the other end of each of the plurality of carbon nanotubes and electrically shorted to the second embedded electrode.

BRIEF DESCRIPTION OF THE SEVERAL VIEWS OF THE DRAWINGS

FIG. 1A is a top-down view of a first exemplary structure after formation of a patterned mask layer on an insulator layer of a substrate according to a first embodiment of the present disclosure.

FIG. 1B is a vertical cross-sectional view of the first exemplary structure of FIG. 1A along the plane B-B' in FIG. 1A.

FIG. 1C is a vertical cross-sectional view of the first exemplary structure of FIG. 1A along the plane C-C' in FIG. 1A.

FIG. 2A is a top-down view of the first exemplary structure after formation of trenches within the insulator layer of the substrate according to the first embodiment of the present disclosure.

FIG. 2B is a vertical cross-sectional view of the first exemplary structure of FIG. 2A along the plane B-B' in FIG. 2A.

FIG. 2C is a vertical cross-sectional view of the first exemplary structure of FIG. 2A along the plane C-C' in FIG. 2A.

FIG. 3A is a top-down view of the first exemplary structure after deposition of a conductive material in the trenches to form a buried gate electrode and embedded electrodes according to the first embodiment of the present disclosure.

FIG. 3B is a vertical cross-sectional view of the first exemplary structure of FIG. 3A along the plane B-B' in FIG. 3A.

FIG. 3C is a vertical cross-sectional view of the first exemplary structure of FIG. 3A along the plane C-C' in FIG. 3A.

FIG. 5A is a top-down view of the first exemplary structure after deposition of a gate dielectric layer according to the first embodiment of the present disclosure.

FIG. 5B is a vertical cross-sectional view of the first exemplary structure of FIG. 5A along the plane B-B' in FIG. 5A.

FIG. 5C is a vertical cross-sectional view of the first exemplary structure of FIG. 5A along the plane C-C' in FIG. 5A.

FIG. 6A is a top-down view of the first exemplary structure after patterning openings in the gate dielectric to physically expose surfaces of the buried gate electrode and embedded electrodes according to the first embodiment of the present disclosure.

FIG. 6B is a vertical cross-sectional view of the first exemplary structure of FIG. 6A along the plane B-B' in FIG. 6A.

FIG. 6C is a vertical cross-sectional view of the first exemplary structure of FIG. 6A along the plane C-C' in FIG. 6A.

FIG. 7A is a top-down view of the first exemplary structure during a dielectrophoresis process, which is performed after placement of the first exemplary structure in a carbon-nanotube-including solution and after connection to a pair of conductive structures to the embedded electrodes, and in which alternating current (AC) voltage is applied across the embedded electrodes to align carbon nanotubes in a direction perpendicular to a lengthwise direction of the buried gate electrode, according to the first embodiment of the present disclosure.

FIG. 7B is a vertical cross-sectional view of the first exemplary structure of FIG. 7A along the plane B-B' in FIG. 7A.

FIG. 9A is a top-down view of the first exemplary structure after formation of various contact electrodes according to the first embodiment of the present disclosure.

FIG. 9B is a vertical cross-sectional view of the first exemplary structure of FIG. 9A along the plane B-B' in FIG. 9A.

FIG. 9C is a vertical cross-sectional view of the first exemplary structure of FIG. 9A along the plane C-C' in FIG. 9A.

FIG. 10A is a top-down view of the first exemplary structure after formation of a contact-level dielectric layer and various contact via structures according to the first embodiment of the present disclosure.

FIG. 10B is a vertical cross-sectional view of the first exemplary structure of FIG. 10A along the plane B-B' in FIG. 10A.

FIG. 10C is a vertical cross-sectional view of the first exemplary structure of FIG. 10A along the plane C-C' in FIG. 10A.

FIG. 12A is a top-down view of the second exemplary structure after formation of various contact electrodes according to the second embodiment of the present disclosure.

FIG. 12B is a vertical cross-sectional view of the second exemplary structure of FIG. 12A along the plane B-B' in FIG. 12A.

FIG. 12C is a vertical cross-sectional view of the second exemplary structure of FIG. 12A along the plane C-C' in FIG. 12A.

FIG. 13A is a top-down view of the second exemplary structure after formation of contact-level dielectric layer and various contact via structures according to the second embodiment of the present disclosure.

FIG. 13B is a vertical cross-sectional view of the second exemplary structure of FIG. 13A along the plane B-B' in FIG. 13A.

FIG. 13C is a vertical cross-sectional view of the second exemplary structure of FIG. 13A along the plane C-C' in FIG. 13A.

DETAILED DESCRIPTION

Figure 4A:
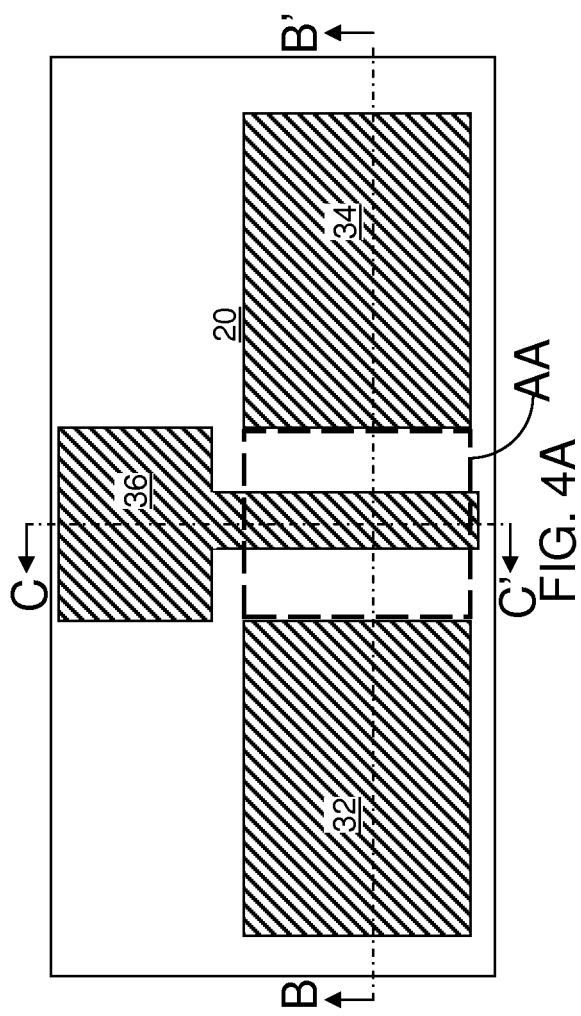
FIG. 4A is a top-down view of the first exemplary structure after lifting off the mask layer from the substrate according to the first embodiment of the present disclosure.

As stated above, the present disclosure relates to a carbon nanotube transistor employing carbon nanotubes self-aligned to embedded electrodes and methods of manufacturing the same, which are now described in detail with accompanying figures. It is noted that like reference numerals refer to like elements across different embodiments.

Referring to FIGS. 1A, 1B, and 1C, a first exemplary structure according to a first embodiment of the present disclosure includes a substrate 8, which includes an insulator layer 20 and an optional handle substrate 10. The insulator layer 20 can be provided as a stand-alone substrate capable of mechanically supporting itself and subsequently formed structures during subsequent handling. Alternatively, the insulator layer 20 can be a thin layer that is formed on a top surface of the handle substrate 10 having sufficient thickness to provide mechanical support during subsequent handling of the substrate 8.

The handle substrate 10 can include a semiconductor material, an insulator material, a conductive material, or a stack thereof. The insulator layer 20 includes a dielectric material, which can be, but is not limited to, silicon oxide, plastics, silicon nitride, silicon oxynitride, a dielectric metal oxide, a dielectric metal oxynitride, organosilicate glass, nitrogen doped organosilicate glass, or a combination or a stack thereof. In one embodiment, the insulator layer 20 can be substituted with an intrinsic semiconductor material having a high resistivity, i.e., a resistivity greater than 100 Ohm-cm. The thickness of the insulator layer 20 can be from 50 nm to 2 cm, although lesser and greater thicknesses can also be employed. The thickness of the substrate 8 can be from 50 microns to 2 cm, although lesser and greater thicknesses can also be employed.

A mask layer 37 is deposited over the top surface of the insulator layer 20, and is lithographically patterned. In one embodiment, the mask layer 37 is a soft mask layer including a carbon-based material. For example, the mask layer 37 can include a photoresist, a material sensitive to electron beam irradiation, i.e., an e-beam resist (e.g., poly(methyl methacrylate) or hydrogen silsesquioxane), or a carbon-based material that is not sensitive to irradiation by photons or electrons. Alternately, the mark layer 37 can be a hard mask layer including a material that is not carbon-based. For example, the mask layer 37 can include a dielectric material different from the dielectric material of the insulator layer, or can include a metallic material. The material of the mask layer 37 is selected such that an etch process exists that can etch the material of the mask layer 37 selective to the material of the insulator layer 20. For example, if the mask layer 37 includes an organic material such as a photoresist or an e-bean resist, the etch process to be subsequently used can employ an organic solvent such as acetone.

If the mask layer 37 includes a photoresist, the mask layer 37 can be patterned by lithographic exposure and subsequent development. If the mask layer 37 includes an e-beam resist, the mask layer 37 can be patterned by exposure with electron beam and subsequent development. If the mask layer 37 is a hard mask layer or if the mask layer 37 includes a carbon-based material that is not sensitive to irradiation by photons or electrons, the mask layer 37 can be patterned by applying a photoresist layer (not shown) or an e-beam resist layer (not shown) thereupon, patterning the photoresist layer or the e-beam resist layer, transferring the pattern into the mask layer 37, and optionally removing the photoresist layer or the e-beam resist layer.

A pair of openings (represented as rectangular openings in FIG. 1A and herein referred to as a first opening and a second opening, respectively) laterally separated by a uniform separation distance s is formed within the mask layer 37. Thus, two proximal sidewalls of the openings in the mask layer 37, i.e., a sidewall of the first opening that is most proximal to the second opening and a sidewall of the second opening that is most proximal to the first opening, are parallel to each other, and are laterally spaced by the separation distance s. In one embodiment, the separation distance is selected to be between ½ and 2 times an average length of carbon nanotubes to be subsequently attached to the exemplary structure. In one embodiment, the separation distance s can be from 200 microns to 1 mm, although lesser and greater separation distances can also be employed.

In a non-limiting exemplary embodiment, each of the pair of openings can be a rectangular opening having a width w. The width w is determined by the target on-current level of a field effect transistor to be subsequently formed. The minimum dimension for the width w is limited by the lithographic capabilities of tools employed to form the pattern of the pair of openings in the mask layer 37. The width w can be in a range from 50 nm to 1 mm, although lesser and greater widths w can also be employed.

The pattern in the mask layer 37 can further include another opening, which is herein referred to as a gate opening. The gate opening includes a portion located between the two parallel sidewalls of the first and second openings of the mask layer 37 that are laterally spaced by the separation distance s.

For example, the gate opening can include a first portion having a lengthwise direction along the two parallel sidewalls and having a gate width wg that is uniform between the two parallel sidewalls, and a second portion attached to an end of the first portion. Thus, the lengthwise direction of the first portion of the gate opening is parallel to the two parallel sidewalls of the first and second openings in the mask layer 36.

The gate width wg is determined by the target width for a gate electrode to be subsequently formed. The minimum dimension for the gate width wg is limited by the lithographic capabilities of tools employed to form the pattern the gate opening. The gate width wg can be from 20 nm to 200 microns, although lesser and greater gate widths wg can also be employed.

Referring to FIGS. 2A, 2B, and 2C, various trenches are formed within an upper portion of the insulator layer 20. Specifically, the pattern in the mask layer 37 is transferred into the upper portion of the insulator layer 20 by an etch, which can be an anisotropic etch such as a reactive ion etch or an isotropic etch such as a wet etch. A first trench 22 is formed underneath the first opening in the mask layer 37, a second trench 24 is formed underneath the second opening in the mask layer 37, and a gate trench 26 is formed underneath the gate opening in the mask layer 37. The first trench 22, the second trench 24, and the gate trench 26 are formed simultaneously by removal of the physically exposed portions of the dielectric material of the insulator layer 20. The first trench 22, the second trench 24, and the gate trench 26 can have the same depth, which can be from 5 nm to 1,000 nm, although lesser and greater depths can also be employed. The shapes of the openings in the mask layer 37 are replicated in the shapes of the first, second, and gate trenches (22, 24, 26).

Referring to FIGS. 3A, 3B, and 3C, a conductive material is anisotropically deposited in the trenches (22, 24, 26) and over the mask layer 37 in a direction perpendicular to the topmost surface of the insulator layer 20. A portion of the conductive material deposited in the first trench 22 forms a first embedded electrode 32. A portion of the conductive material deposited in the second trench 24 forms a second embedded electrode 34. A portion of the conductive material deposited in the gate trench 26 forms a buried gate electrode 36. The conductive material deposited over the mask layer 37 is herein referred to an overlying conductive material layer 31. The first embedded electrode 32, the second embedded electrode 34, the buried gate electrode 36, and the overlying conductive material layer 31 are formed simultaneously.

The first embedded electrode 32, the second embedded electrode 34, the buried gate electrode 36, and the overlying conductive material layer 31 includes an elemental metal, an alloy of at least two elemental metals, a conductive metallic nitride, a conductive metallic carbide, a doped semiconductor material, an alloy thereof, and/or a stack thereof. The materials that can be employed for the first embedded electrode 32, the second embedded electrode 34, the buried gate electrode 36, and the overlying conductive material layer 31 include, but are not limited to, Pd, Pt, Ni, Au, Ag, Cu, Al, Ti, Ta, W, TiN, TaN, WN, TiC, TaC, WC, doped silicon, an alloy thereof, and a stack thereof.

The conductive material of the first embedded electrode 32, the second embedded electrode 34, the buried gate electrode 36, and the overlying conductive material layer 31 can be deposited, for example, by vacuum evaporation, physical vapor deposition, or a combination thereof.

The first embedded electrode 32, the second embedded electrode 34, the buried gate electrode 36, and the overlying conductive material layer 31 have a same composition and a same thickness. The thickness of the first embedded electrode 32, the second embedded electrode 34, and the buried gate electrode 36 can be from 5 nm to 1,000 nm, although lesser and greater thicknesses can also be employed. In one embodiment, the thickness of the first embedded electrode 32, the second embedded electrode 34, and the buried gate electrode 36 can be the same as the depth of the first trench 22, the second trench 24, and the gate trench 26. In this embodiment, the top surfaces of the first embedded electrode 32, the second embedded electrode 34, and the buried gate electrode 36 can be coplanar with the topmost surface of the insulator layer 20.

Figure 4C:
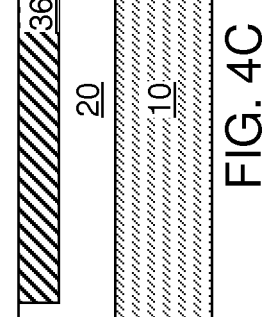
FIG. 4C is a vertical cross-sectional view of the first exemplary structure of FIG. 4A along the plane C-C' in FIG. 4A.
Figure 4B:
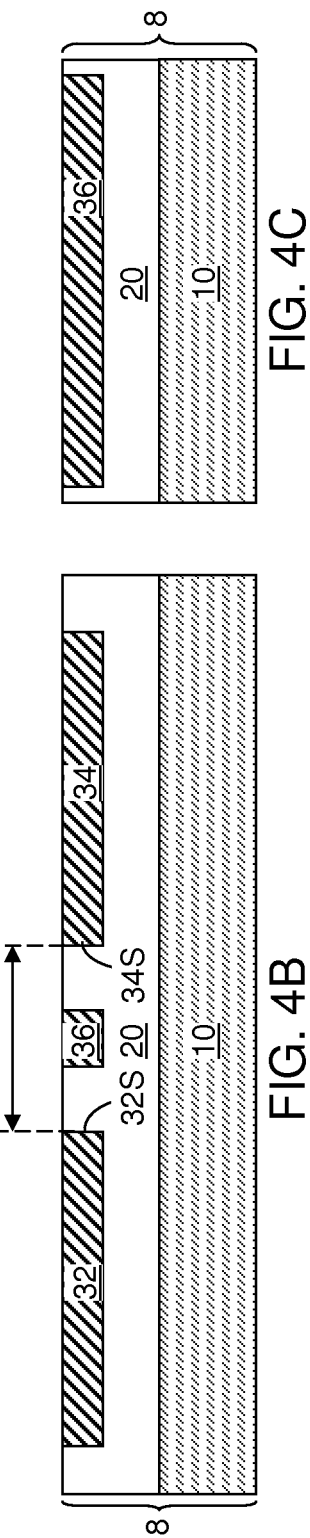
FIG. 4B is a vertical cross-sectional view of the first exemplary structure of FIG. 4A along the plane B-B' in FIG. 4A.

Referring to FIGS. 4A, 4B, and 4C, the mask layer 37 and the overlying conductive material layer 31 are lifted off the substrate 8, for example, by an etch. The etch can be a wet etch that dissolves the material of the mask layer 37 selective to the dielectric material of the insulator layer 20 and selective to the conductive material of the first embedded electrode 32, the second embedded electrode 34, and the buried gate electrode 36. For example, if the mask layer 37 is a soft mask layer, an organic solvent that dissolves the carbon-based material of the soft mask layer selective to the dielectric material of the insulator layer 20 and the conductive material of the first embedded electrode 32, the second embedded electrode 34, and the buried gate electrode 36 can be employed. If the mask layer 37 is a hard mask layer, a wet etch chemistry that dissolves the material of the hard mask layer selective the dielectric material of the insulator layer 20 and the conductive material of the first embedded electrode 32, the second embedded electrode 34, and the buried gate electrode 36 can be employed. The overlying conductive material layer 31 is not dissolved during the lift-off process, but is physically separated from the substrate 8 as the material of the mask layer 37 is etched or dissolved.

A first sidewall 32S of the first embedded electrode 32 that is most proximal to the second embedded electrode 34 is parallel to a second sidewall 34S of the second embedded electrode 34 that is most proximal to the first embedded electrode 32. The first sidewall 32S and the second sidewall 34S are laterally spaced by the separation distance s. The lengthwise direction of the buried gate electrode 36 (e.g., a horizontal direction along the vertical plane C-C') is parallel to the first and second sidewalls (32S, 34S) between an entire area AA between the first sidewall 32S and the second sidewall 34S, i.e., within the area AA defined by a rectangle having corners that coincide with two ends of the first sidewall 32S and two ends of the second sidewall 34S in a top-down view such as FIG. 4A).

Referring to FIGS. 5A, 5B, and 5C, a gate dielectric layer 50 is deposited directly on the physically exposed top surfaces of the insulator layer 20, the first electrode 32, the second electrode 34, and the buried gate electrode 36. The dielectric layer 50 functions as the gate dielectric layer of a field effect transistor to be subsequently formed.

The gate dielectric layer 50 includes a dielectric material such as a dielectric metal oxide (e.g., aluminum oxide, a dielectric rare-earth oxide, or a dielectric transition metal oxide), silicon oxide, silicon nitride, silicon oxynitride, or a combination thereof. The gate dielectric layer 50 can be deposited, for example, by atomic layer deposition (ALD), chemical vapor deposition (CVD), plasma sputtering, and electron-beam evaporation. The thickness of the gate dielectric layer 50 can be from 1 nm to 10 nm, although lesser and greater thicknesses can also be employed. The entirety of the physically exposed upper surface of the gate dielectric layer 50 is a dielectric surface.

Referring to FIGS. 6A, 6B, and 6C, gate dielectric openings are patterned in the gate dielectric layer 50 to physically expose surfaces of the first embedded electrode 32, the second embedded electrode 34, and the buried gate electrode 36. The openings include a first gate dielectric opening 52 that overlies a portion of the first embedded electrode 32, a second gate dielectric opening 54 that overlies a portion of the second embedded electrode 34, and a third gate dielectric opening 56 that overlies a portion of the buried gate electrode 36 that does not overlap with the area AA. The various gate dielectric openings (52, 54, 56) can be formed, for example, by applying a photoresist (not shown), lithographically patterning the photoresist by lithographic exposure and development, transferring the pattern in the developed photoresist into the gate dielectric layer 50 by an etch (which can be a wet etch or a dry etch), and removing the photoresist, for example, by ashing.

Referring FIGS. 7A and 7B, the first exemplary structure is placed in a carbon-nanotube-including solution 66 provided in a container 68. The entirety of the first exemplary structure can be immersed within the carbon-nanotube-including solution 66. The container 68 can be a basin or a sealed chamber configured to load the first exemplary structure and to be filled with the carbon-nanotube-including solution 66. The carbon-nanotube-including solution 66 includes carbon nanotubes 60 that float around in a liquid 66. Alternatively, a droplet of carbon nanotube solution can be deposited on the substrate 8 locally.

In one embodiment, the carbon-nanotube-including solution 66 can be a water-based (i.e., aqueous) solution including at least one surfactant that impedes or prevents clustering of the carbon nanotubes 60 therein. In other words, the at least one surfactant prevents carbon nanotubes 60 that float within the carbon-nanotube-including solution 66 from coalescing into a cluster. For example, the carbon-nanotube-including solution 66 can include a soap solution. In this case, the at least one surfactant within the carbon-nanotube-including solution 66 can include at least one of sodium dodecyl sulfate, sodium cholate, sodium dodecylbenzenesulfonate, sodium tallowate, sodium carboxylate, potassium dodecyl sulfate, potassium cholate, potassium dodecylbenzenesulfonate, potassium tallowate, and potassium carboxylate, or any other compound derived from substitution of at least one hydroxyl group in lauric acid, myristic acid, palmitic acid, stearic acid, oleic acid, or linoleic acid with at least one cation.

In one embodiment, the average length of the carbon nanotubes 60 within the carbon-nanotube-including solution 66 can be from ½ to 2 times the separation distance s. The average length of the carbon nanotubes 60 within the carbon-nanotube-including solution 66 can be, for example, from 200 microns to 1 mm, although lesser and greater average lengths can also be employed. The average diameter of the carbon nanotubes 60 can be any number known in the art. In one embodiment, the average diameter of the carbon nanotubes 60 is selected such that the carbon nanotubes 60 are semiconducting, and are not metallic.

A pair of conductive structures is connected to the first and second embedded electrodes (32, 34) through the first and second gate dielectric openings (52, 54; See FIGS. 6A and 6B). Specifically, a first conductive structure 62 physically contacts, and is conductively connected to, the top surface of the first embedded electrode 32, and a second conductive structure 64 physically contacts, and is conductively connected to, the top surface of the second embedded electrode 34. In one embodiment, the lateral surfaces of the first conductive structure 62 and the second conductive structure 64 can be coated with a dielectric coating (not shown) to reduce conduction of electricity between the first conductive structure 62 and the second conductive structure 64 through the carbon-nanotube-including solution 66.

An alternating current (AC) voltage source 98 is connected across an upper end of the first conductive structure 62 and an upper end of the second conductive structure 64. An openended electrical circuit is formed, which includes the AC voltage source 98 in the middle, the combination of the first conductive structure 62 and the first embedded electrode 32 at one end, and the combination of the second conductive structure 64 and the second embedded electrode 64 at the other end.

The AC voltage source 98 is turned on to apply an alternating current (AC) voltage across the first embedded electrode 32 and the second embedded electrode 64. The AC voltage generates an AC electrical field around the region between the first embedded electrode 62 and the second embedded electrode 64. The direction of the AC electrical field at any given point within the carbon-nanotube-including solution 66 changes between two opposite orientations with the frequency of the AC electrical field. Further, the magnitude of the AC electrical field at any given point within the carbon-nanotube-including solution 66 modulates at twice the frequency of the AC electrical field. The vector representing the AC electrical field at any given point within the carbon-nanotube-including solution 66 is a sinusoidal vector that modulates at the frequency of the AC voltage generated by the AC voltage source 98.

During the course of research leading to the present disclosure, it has been observed that carbon nanotubes 60 tend to align to the direction of the local electrical field that modulates at the frequency of the AC voltage generated by the AC voltage source. A net attractive electrical force due to the interaction of the electrical field with free charge carriers (electrons) in the carbon nanotubes 60 causes an assembly of carbon nanotubes 60 along the direction of the electric field. The density of the carbon nanotubes 60 and the degree of alignment of the carbon nanotubes 60 (e.g., the root mean square deviation of the angles of the lengthwise directions of the aligned carbon nanotubes relative to the average of the directions) can be adjusted as needed.

Carbon nanotubes 60 are aligned in situ on the gate dielectric layer 50 from the carbon-nanotube-including solution 66. Because the first embedded electrode 32 and the second embedded electrode 34 are separated by a uniform separation distance s, the electrical field immediately above the top surface of the gate dielectric layer 50 within the area AA is substantially perpendicular to the first sidewall 32S of the first embedded electrode 32 that is most proximal to the second embedded electrode 34, and is substantially perpendicular to the second sidewall 34S of the second embedded electrode 34 that is most proximal to the first embedded electrode 32.

Thus, carbon nanotubes 60 that happen to float toward the region immediately above the top surface of the gate dielectric layer 50 within the area AA becomes oriented parallel to the average direction of the local electrical field (which is averaged over the volume of that carbon nanotube 60), which is perpendicular to the first sidewall 32S and the second sidewall 34S. The AC electrical field applies a net torque to carbon nanotubes 60 that are not aligned along the direction of the local electrical field. The net torque is schematically illustrated by arrows in FIG. 7A. The process of aligning the orientations of the carbon nanotubes 60 along the local direction of AC electrical field is herein referred to as a "dielectrophoresis" process.

A plurality of carbon nanotubes 60 in physical proximity to the dielectric surface of the gate dielectric layer 50 is attached to the dielectric surface of the gate dielectric layer 50 in substantially parallel self-alignment along the electrical field. Specifically, a carbon nanotube 60 aligned along the direction perpendicular to the first sidewall 32S and the second sidewall 34S can move, for example, due to Brownian motion, to a position within a distance from the dielectric surface of the gate dielectric layer 50 at which Van der Waals force comes into effect. If a sufficient fraction of a carbon nanotube 60 comes within the distance below which Van der Waals force is effective from the surface of the gate dielectric layer 50, that carbon nanotube 60 is in physical proximity to the dielectric surface of the gate dielectric layer 50. Such a carbon nanotube 60 is pulled to the dielectric surface of the gate dielectric layer 50, and subsequently comes into contact with the dielectric surface of the gate dielectric layer 50. Upon contact with the dielectric surface of the gate dielectric layer 50, such a carbon nanotube 60 is chemically bonded to the gate dielectric layer 50. Atomic level bonding between the carbon nanotubes 60 and the gate dielectric layer 50 prevents carbon nanotubes 60 that are attached to the gate dielectric layer 50 from being dissociated from the gate dielectric layer 50.

Further, because the surfactant prevents carbon nanotubes 60 from coalescing with one another, once a carbon nanotube 60 is attached to a dielectric surface portion of the gate dielectric layer 50, additional carbon nanotubes 60 are repelled from the vicinity of the attached carbon nanotube 60. Therefore, the attached carbon nanotubes 60 are self-aligned along the direction perpendicular to the first sidewall 32S and the second sidewall 34S, which is the horizontal direction perpendicular to the lengthwise direction of the buried gate electrode 36). Further, the attached carbon nanotubes 60 are separated from neighboring carbon nanotubes by at least a minimum spacing, which is determined by the species and concentration of the surfactant present within the carbon-nanotube-including solution 66.

The voltage amplitude and frequency of the AC voltage applied by the AC voltage source 98 are selected to induce carbon nanotubes 60 to be aligned in the local direction of the electrical field generated by the AC voltage. During the course of research leading to the present disclosure, it has been discovered that effective alignment of carbon nanotubes 60 can be achieved by selecting a frequency for the AC voltage from a frequency range from 20 kHz to 20 MHz, although it is likely that a frequency above or below this frequency can also be employed for aligning the carbon nanotubes 60, albeit with potential reduction in efficiency. Further, during the course of research leading to the present disclosure, it has been discovered that voltage amplitude can be selected so that a maximum electrical field amplitude of the electrical field is between $5 \times 10^3$ V/cm and $5 \times 10^5$ V/cm at a point P on the dielectric top surface of the gate dielectric layer 50 that is equidistant from the first and second embedded electrodes (32, 34).

Because no mechanical force is applied to the carbon nanotubes 60 during the assembly of a plurality of carbon nanotubes 60 on the surface of the gate dielectric layer 50 through a solid object, bending or other types of mechanical distortion of the carbon nanotubes 60 is minimized during the assembly of the plurality of carbon nanotubes 60. The carbon nanotubes 60 attached to the top surface of the gate dielectric layer 50 are substantially parallel to one another, and are located on a portion of the gate dielectric layer overlying the portion of the insulator layer 20 located between the first embedded electrode 32 and the second embedded electrode 34.

The first exemplary structure including the plurality of attached carbon nanotubes 60 is separated from the carbon-nanotube-including solution 66, for example, by lifting up the first exemplary structure out of the carbon-nanotube-including solution 66, or by draining the carbon-nanotube-including solution 66. Any remaining carbon-nanotube-including solution 66 can be removed from the surface of the gate dielectric layer 50, for example, by blow-drying with compressed air or compressed inert gas. The adhesive force between the carbon nanotubes 60 and the gate dielectric layer 50 keeps the carbon nanotubes 60 attached to the gate dielectric layer 50 during the blow-drying.

A suitable wet clean, e.g., deionized water rinse, may be optionally performed to remove any residual surfactant. Carbon nanotubes 60 that are attached outside the area AA can be optionally removed, for example, by a brush clean.

Figure 8:
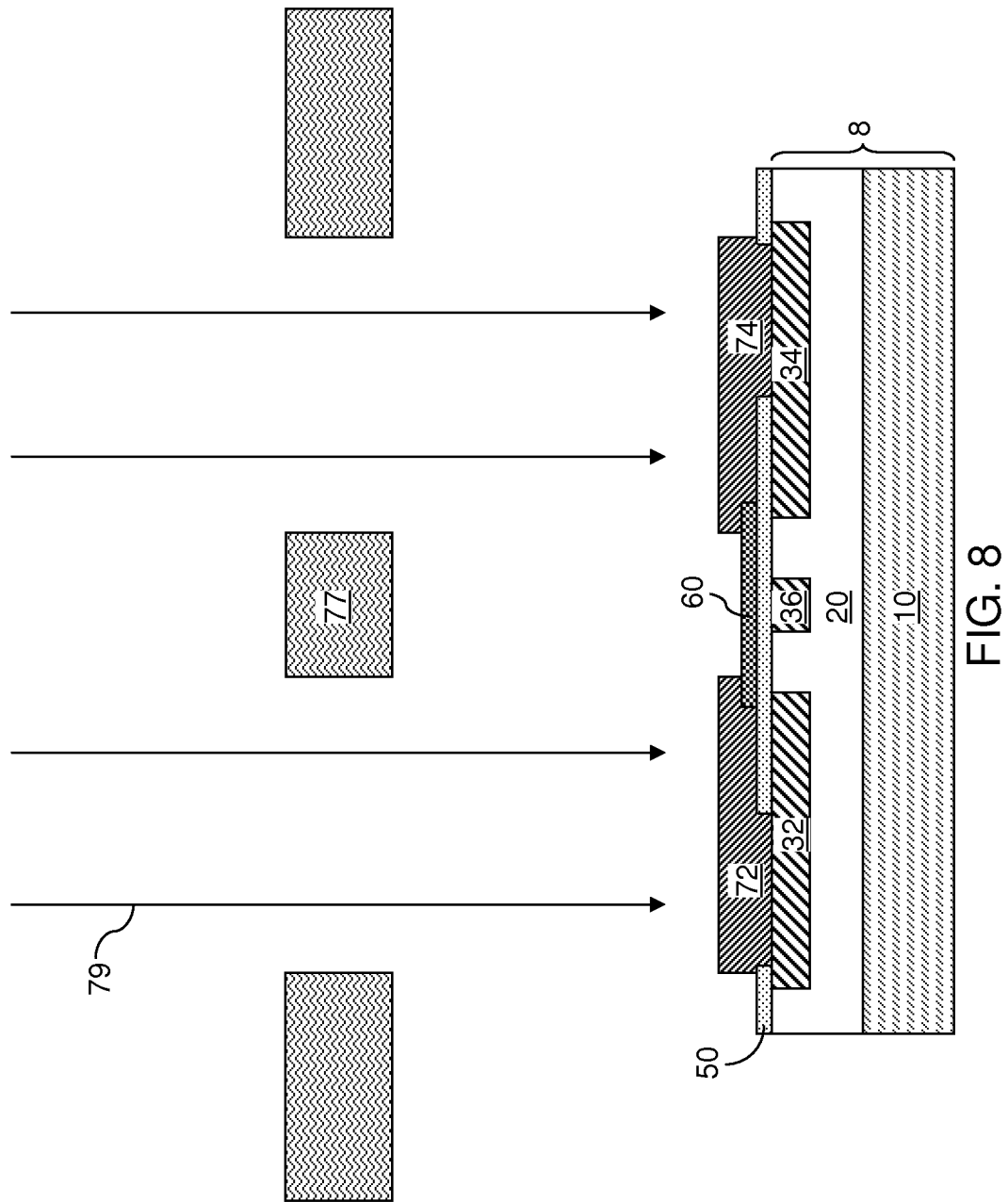
FIG. 8 is a schematic view of the first exemplary structure during a masked deposition process according to the first embodiment of the present disclosure.

Referring to FIG. 8, a masked deposition process is performed to deposit patterned conductive structures on the first exemplary structure. A physical mask structure 77 is placed between the source of a conductive material and the front surface of the first exemplary structure so that the conductive material is deposited only on desired areas of the first exemplary structure to form a plurality of laterally separated conductive structures. Alternatively, a soft mask such as a photoresist layer (not shown) may be deposited and patterned to form an opening therein. The patterned soft mask can replace the physical mask structure.

The masked deposition process can be an evaporation deposition process employing the physical mask structure between the evaporation source and the first exemplary structure, a directional physical vapor deposition (PVD) process employing the physical mask structure between the evaporation source and the first exemplary structure, or any other deposition process that can provide a directional beam 79 of conductive material particles, as an atom, a cluster of atoms, a molecule, or a cluster of molecules. The patterned conductive structures can include a first contact electrode 72 that is deposited on a first end portion of each carbon nanotube 60, and a second contact electrode 74 that is deposited on a second end portion of each carbon nanotube 60. Each first end portion of a carbon nanotube 60 is more proximal to the first embedded electrode 32 than to the second embedded electrode 34, and each second end portion of a carbon nanotube 60 is more proximal to the second embedded electrode 34 than to the first embedded electrode 32. Thus, the carbon nanotubes 60 are electrically and physically contacted by the first contact electrode 72 and the second contact electrode 74. If a patterned soft mask is employed in lieu of the physical mask structure 77, the patterned soft mask can be subsequently lifted off, for example, by a wet etch.

FIGS. 9A, 9B, and 9C illustrate the first exemplary structure after the masked deposition process is completed. The patterned conductive structures can further include a gate contact electrode 76, which is in contact with the top surface of the gate dielectric layer 50. The gate contact electrode 76 is in physical contact with, and is electrically shorted to, the buried gate electrode 36. Each of the first contact electrode 72 and the second contact electrode 74 may be in contact with the top surface of the gate dielectric layer 50. The first contact electrode 72 is in physical contact with, and is electrically shorted to, the first embedded electrode 32. The second contact electrode 74 is in physical contact with, and is electrically shorted to, the second embedded electrode 34. Thus, each of the first contact electrode 72 and the second contact electrode 74 is formed directly on end portions of each of the attached plurality of carbon nanotubes 60 and the over one of the first embedded electrode 32 and the second embedded electrode 34.

The first contact electrode 72, the second contact electrode 74, and the gate contact electrode 76 can include an elemental metal, an alloy of at least two elemental metals, a conductive metallic nitride, a conductive metallic carbide, a doped semiconductor material, an alloy thereof, and/or a stack thereof. The materials that can be employed for the first contact electrode 72, the second contact electrode 74, and the gate contact electrode 76 include, but are not limited to, Pd, Pt, Ni, Au, Ag, Cu, Al, Ti, Ta, W, TiN, TaN, WN, TiC, TaC, WC, doped silicon, an alloy thereof, and a stack thereof. The thickness of the first contact electrode 72, the second contact electrode 74, and the gate contact electrode 76, as measured over a planar portion of the gate dielectric layer 50, can be from 5 nm to 1,000 nm, although lesser and greater thicknesses can also be employed.

Referring to FIGS. 10A, 10B, and 10C, a contact-level dielectric layer 80 is formed over the plurality of carbon nanotubes 60 and the various contact electrodes (72, 74, 76). The contact-level dielectric layer 80 includes a dielectric material, which can be silicon oxide, silicon nitride, silicon oxynitride, organosilicate glass, a dielectric metal oxide, or any other dielectric material that can encapsulate the underlying plurality of carbon nanotubes 60 and the various contact electrodes (72, 74, 76).

Various contact via structures can be formed in the contact-level dielectric layer 80. For example, the various contact via structures can include a first contact via structure 82 that contacts the first contact electrode 72, a second contact via structure 84 that contacts the second contact electrode 74, and a gate contact via structure 86 that contact the gate contact electrode 76. The first contact via structure 82 is in physical contact with the top surface of the first contact electrode 72, and can optionally contact the first embedded electrode 32 if the first contact via structure 82 extends vertically at least to the bottom surface of the gate dielectric layer 50. Likewise, the second contact via structure 84 is in physical contact with the top surface of the second contact electrode 74, and can optionally contact the second embedded electrode 34 if the second contact via structure 84 extends vertically at least to the bottom surface of the gate dielectric layer 50. The gate contact via structure 86 is in physical contact with the top surface of the gate contact electrode 76, and can optionally contact the buried gate electrode 36 if the gate contact via structure 86 extends vertically at least to the bottom surface of the gate dielectric layer 50.

Figure 11:
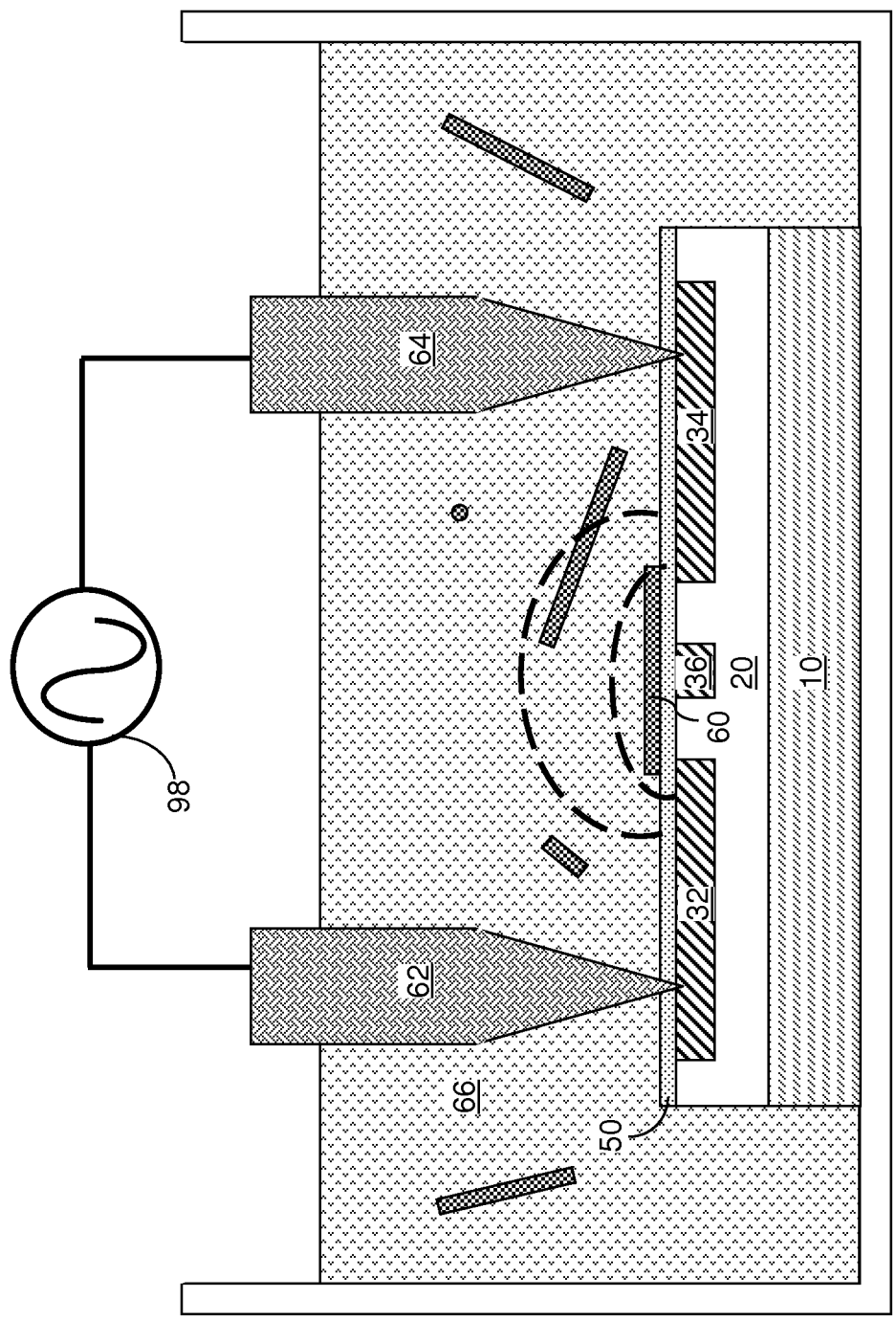
FIG. 11 is a schematic view of a second exemplary structure, which is derived from the first exemplary structure by omitting the processing steps of FIGS. 6A, 6B, and 6C, during a dielectrophoresis process according to a second embodiment of the present disclosure.

Referring to FIG. 11, a second exemplary structure can be derived from the first exemplary structure of FIGS. 5A, 5B, and 5C by omitting the processing steps of FIGS. 6A, 6B, and 6C, and performing the processing steps of FIGS. 7A and 7B. The top surfaces of the first embedded electrode 32 and the second embedded electrode 34 are not physically exposed at the time of placement within the carbon-nanotube-including solution 66. Each of the first conductive structure 62 and the second conductive structure 64 have a pointy end, which can be employed to puncture the gate dielectric layer 50 in order to form a physical contact between the first conductive structure 62 and the first embedded electrode 32, and between the second conductive structure 64 and the second embedded structure 34, respectively.

The same dielectrophoresis process can be performed as in the first embodiment to form a plurality of carbon nanotubes 60 attached to the top surface of the gate dielectric layer 60.

Referring to FIGS. 12A, 12B, and 12C, the same processing steps are performed as in the processing steps of FIGS. 8, 9A, 9B, and 9C in the first embodiment. Depending on the location of holes (not shown) that are formed as a result of puncture by the first conductive structure 62 and the second conductive structure 64, the first contact electrode 72 and the second contact electrode 74 may, or may not, be in physical contact with the first embedded electrode 32 and the second embedded electrode 34, respectively.

Referring to FIGS. 13A, 13B, and 13C, a contact-level dielectric layer 80 is formed over the plurality of carbon nanotubes 60 and the various contact electrodes (72, 74, 76).

The contact-level dielectric layer 80 includes the same dielectric material as in the first embodiment.

Various contact via structures can be formed in the contact-level dielectric layer 80. For example, the various contact via structures can include a first contact via structure 82 that extends through the gate dielectric layer 50 and physically contacts the first contact electrode 72 and the first embedded electrode 32, a second contact via structure 84 that extends through the gate dielectric layer 50 and physically contacts the second contact electrode 74 and the second embedded electrode 34, and a gate contact via structure 86 that extends through the gate dielectric layer 50 and contact the gate contact electrode 76 and the buried gate electrode 36. Thus, the first embedded electrode 32 is electrically shorted to the first contact electrode 72, the second embedded electrode 34 is electrically shorted to the second contact electrode 74, and the buried gate electrode 36 is electrically shorted to the gate contact electrode 76.

By electrically shorting each of the pair of the first contact electrode 72 and the first embedded electrode 32, the pair of the second contact electrode 74 and the second embedded electrode 34, and the pair of the gate contact electrode 76 and the buried gate electrode 36, parasitic capacitance of the first contact electrode 72, the second contact electrode 74, and the buried gate electrode 36 can be minimized, and the performance of the field effect transistor employing the plurality of carbon nanotubes 60 as channels for carrier conduction can be enhanced.

According to an aspect of the present disclosure, carbon nanotube field-effect transistors can be fabricated using a planar structure including a buried gate electrode and embedded electrodes to provide controlled, solution-based assembly of high-performance carbon nanotube channels. The carbon nanotube transistor can provide significantly enhanced performance in terms of drive current and speed compared to prior art transistors employing carbon nanotubes because a plurality of carbon nanotubes can be aligned along the same direction through self-assembly in the solution environment in the presence of an alternating current electrical field.

The carbon nanotube assembly process is a highly-scalable, low-temperature process that can be employed to carbon nanotube devices including, but not limited to, carbon nanotube transistors. The methods of the present disclosure can be applied to various types of substrates, contact metals, and gate dielectrics. Thus, critical device dimensions such as the gate dielectric thickness, the channel length, and the contact size, can be independently scaled. Compared with other fabrication methods known in the art, control of the carbon nanotube placement is enhanced while chemical exposure, heating, and/or bending of carbon nanotubes are minimized. Further, gate coupling can be readily optimized, and the quality of the contacts to the source and the drain of the field effect transistor can be enhanced.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A structure comprising:
    a first embedded electrode and a second embedded electrode located in an insulator layer of a substrate;
    a dielectric layer located directly on a topmost surface of said insulator layer;
    a buried gate electrode embedded in said insulator layer and having a topmost surface in direct contact with a bottom surface of said dielectric layer; and
    a plurality of carbon nanotubes that are substantially parallel to one another and located on a portion of said dielectric layer overlying a portion of said insulator layer between said first embedded electrode and said second embedded electrode.

2. The structure of claim 1, wherein said dielectric layer is a gate dielectric layer of a field effect transistor.

3. The structure of claim 1, further comprising a gate contact electrode in contact with a top surface of said dielectric layer and electrically shorted to said buried gate electrode.

4. The structure of claim 2, wherein said buried gate electrode, said first embedded electrode, and said second embedded electrode comprise a same conductive material and have a same thickness.

5. The structure of claim 1, further comprising:
    a first contact electrode in contact with one end of each of said plurality of carbon nanotubes and electrically shorted to said first embedded electrode; and
    a second contact electrode in contact with another end of each of said plurality of carbon nanotubes and electrically shorted to said second embedded electrode.

6. The structure of claim 5, further comprising a gate contact electrode in physical contact with, and electrically shorted to said buried gate electrode.

7. The structure of claim 6, wherein said gate contact electrode is in contact with a top surface of said dielectric layer.

8. The structure of claim 6, wherein said gate contact electrode, said first contact electrode, and said second contact electrode have a same composition and a same thickness.

9. The structure of claim 6, wherein said gate contact electrode contacts sidewall surface areas of said plurality of carbon nanotubes.

10. The structure of claim 5, further comprising at least one dielectric material layer located over said first and second contact electrodes and said plurality of carbon nanotubes.

11. The structure of claim 10, further comprising:
    a first contact via structure embedded in said at least one dielectric material layer and in contact with said first contact electrode; and
    a second contact via structure embedded in said at least one dielectric material layer and in contact with said second contact electrode.

12. The structure of claim 11, wherein said first contact via structure is in contact with said first embedded electrode, and said second contact via structure is in contact with said second embedded electrode.

13. The structure of claim 11, wherein said first contact via structure extends through said dielectric layer and is in contact with said first embedded electrode, and said second contact via structure extends through said dielectric layer and is in contact with said second embedded electrode.

14. The structure of claim 5, wherein said first contact electrode contacts said first embedded electrode through a hole in said dielectric layer, and said second contact electrode contacts said second embedded electrode through another hole in said dielectric layer.

15. The structure of claim 1, wherein a portion of said buried gate electrode underlying said plurality of carbon nanotubes has a uniform width.

16. The structure of claim 1, wherein top surfaces of said first embedded electrode and said second embedded electrode is coplanar with a topmost surface of said insulator layer.

17. The structure of claim 16, wherein a top surface of said buried gate electrode is coplanar with said topmost surface of said insulator layer.

18. The structure of claim 1, wherein said dielectric layer comprises a material selected from a dielectric metal oxide, silicon oxide, silicon nitride, silicon oxynitride, and a combination thereof.

\* \* \* \* \*